(12) United States Patent
Niimi et al.

(10) Patent No.: US 6,924,239 B2
(45) Date of Patent: Aug. 2, 2005

(54) METHOD FOR REMOVAL OF HYDROCARBON CONTAMINATION ON GATE OXIDE PRIOR TO NON-THERMAL NITRIDATION USING "SPIKE" RADICAL OXIDATION

(75) Inventors: Hiroaki Niimi, Tokyo (JP); Husam N. Alshareef, Murphy, TX (US); Ajith Varghese, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/684,897

(22) Filed: Oct. 14, 2003

(65) Prior Publication Data

US 2005/0079723 A1 Apr. 14, 2005

(51) Int. Cl.⁷ .................. H01L 21/302; H01L 21/31
(52) U.S. Cl. ............... 438/706; 438/710; 438/723; 438/728; 438/777
(58) Field of Search ................ 438/706, 710, 438/723, 726–728, 775–777

(56) References Cited

U.S. PATENT DOCUMENTS

| | | | |
|---|---|---|---|
| 6,303,482 B1 * | 10/2001 | Wu et al. ............ | 438/592 |
| 6,613,695 B2 | 9/2003 | Pomarede et al. | |
| 6,674,502 B1 * | 1/2004 | Terakado et al. ........... | 349/147 |
| 6,767,836 B2 * | 7/2004 | San et al. ............... | 438/710 |
| 2004/0018715 A1 * | 1/2004 | Sun et al. ............... | 438/622 |
| 2004/0121620 A1 * | 6/2004 | Pomarede et al. ......... | 438/785 |
| 2004/0161899 A1 * | 8/2004 | Luo et al. ............... | 438/287 |

* cited by examiner

*Primary Examiner*—Mary Wilczewski
*Assistant Examiner*—Toniae M. Thomas
(74) *Attorney, Agent, or Firm*—Yingsheng Tung; Wade James Brady, III; Frederick J. Telecky, Jr.

(57) ABSTRACT

The present invention is generally directed towards a method for removing hydrocarbon contamination from a substrate prior to a nitridation step, therein providing for a generally uniform nitridation of the substrate. The method comprises placing the substrate in a process chamber and flowing an oxygen-source gas into the process chamber. A first plasma is formed in the process chamber for a first predetermined amount of time, wherein the hydrocarbons combine with one or more species of the oxygen-source gas in radical form to form product gases. The gases are removed from the process chamber and a nitrogen-source gas is flowed into the process chamber. A second plasma is then formed in the process chamber for a second predetermined amount of time, therein nitriding the substrate in a significantly uniform manner.

21 Claims, 6 Drawing Sheets

METHOD FOR REMOVAL OF HYDROCARBON CONTAMINATION ON GATE OXIDE PRIOR TO NON-THERMAL NITRIDATION USING "SPIKE" RADICAL OXIDATION

FIELD OF INVENTION

The present invention relates generally to processing of a semiconductor substrate, and more particularly to a method of removing hydrocarbon contamination from the substrate.

BACKGROUND OF THE INVENTION

In the semiconductor industry, smaller and faster devices are in constant demand. In complementary metal oxide silicon (CMOS) technology, a need to enhance the speed and increase the density of CMOS integrated circuits (ICs) has resulted in the evolution of transistor scaling, accompanied by a progressively thinner gate dielectric, typically an oxide. A reduction in the thickness of the gate dielectric provides increased drive current, thereby resulting in an increase in transistor speed. In addition, a thinner gate dielectric offers enhanced control of channel charge, thereby reducing short channel effects. The fabrication of thinner gate oxides, however, presents gate leakage current problems and reliability issues. In particular, physically thinner gate oxides exhibit a gate leakage current which increases exponentially with the reduction in thickness.

The gate leakage current can be mitigated by introducing nitrogen atoms into the gate dielectric. Introducing nitrogen to the gate dielectric generally reduces the gate leakage current through the gate dielectric increasing the dielectric constant of the gate dielectric. One method of nitrogen atom introduction is to perform non-thermal nitridation (e.g., plasma nitridation) on the gate dielectric. Exposure of the substrate to air and airborne molecular contaminants (AMCs), such as organic hydrocarbons, prior to the nitridation of the gate dielectric, however, can result in inadvertent non-uniformities in the nitridation of the gate dielectric, therein causing non-uniformities in gate leakage current associated therewith. Such inadvertent non-uniformities can deleteriously increase an equivalent oxide thickness (EOT) of the gate dielectric.

Accordingly, AMCs can cause an increased and variable dielectric constant (and hence, EOT variability) across a surface of a single wafer depending on the location of the AMCs across the surface, as well as causing EOT variabilities from wafer to wafer. Variablilites in dielectric constants caused by AMCs are especially prevalent as EOTs are reduced below about 20 Å. Furthermore, AMCs typically cause an increased surface roughness of the gate oxide, wherein the roughness in the gate oxide film can further degrade the performance of the subsequently nitrided gate dielectric. Therefore, a need exists in the art for a process for generally eliminating AMCs prior to processes such as plasma nitridation.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to a method for processing a substrate having airborne molecular contaminants (AMCs) residing on a surface thereof. The AMCs, for example, comprise hydrocarbons from an ambient atmosphere such as a holding area environment or clean room, or from residual hydrocarbon contamination from prior processing of the substrate. The method comprises placing the substrate having a gate dielectric layer formed thereon in a process chamber, and flowing oxygen gas into the process chamber at a first pressure. A first plasma is formed in the process chamber, wherein the oxygen gas generally forms the first plasma upon an application of a first power.

According to one exemplary aspect of the invention, the oxygen gas comprises one or more oxygen species, wherein one or more oxygen radicals are formed in the formation of the first plasma. The one or more oxygen radicals generally combine with the AMCs, therein generally forming resultant gases hydrogen and carbon dioxide, wherein a surface of the gate dielectric layer is generally AMC-free after the first plasma is formed. The first plasma, for example, is formed for a first predetermined amount of time, wherein the first predetermined amount of time is less than a few seconds. The first predetermined amount of time, for example, is determined such that oxidation of the gate dielectric layer is substantially prevented, but that most AMCs are generally transformed into the resultant gases, therein defining a "spike radical oxidation" of the gate dielectric layer.

In accordance with another exemplary aspect of the invention, following the spike radical oxidation, the resultant gases are generally removed from the process chamber, and one or more species of nitrogen gas is flowed into the process chamber. A second plasma is formed in the process chamber, wherein the second plasma is formed by an application of a second power to the nitrogen gas. One or more nitrogen radicals associated with the second plasma are then introduced into the gate dielectric layer, therein nitriding the gate dielectric layer, wherein the nitridation of the gate dielectric layer is substantially greater than a nitridation of a substrate having AMCs residing thereon.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
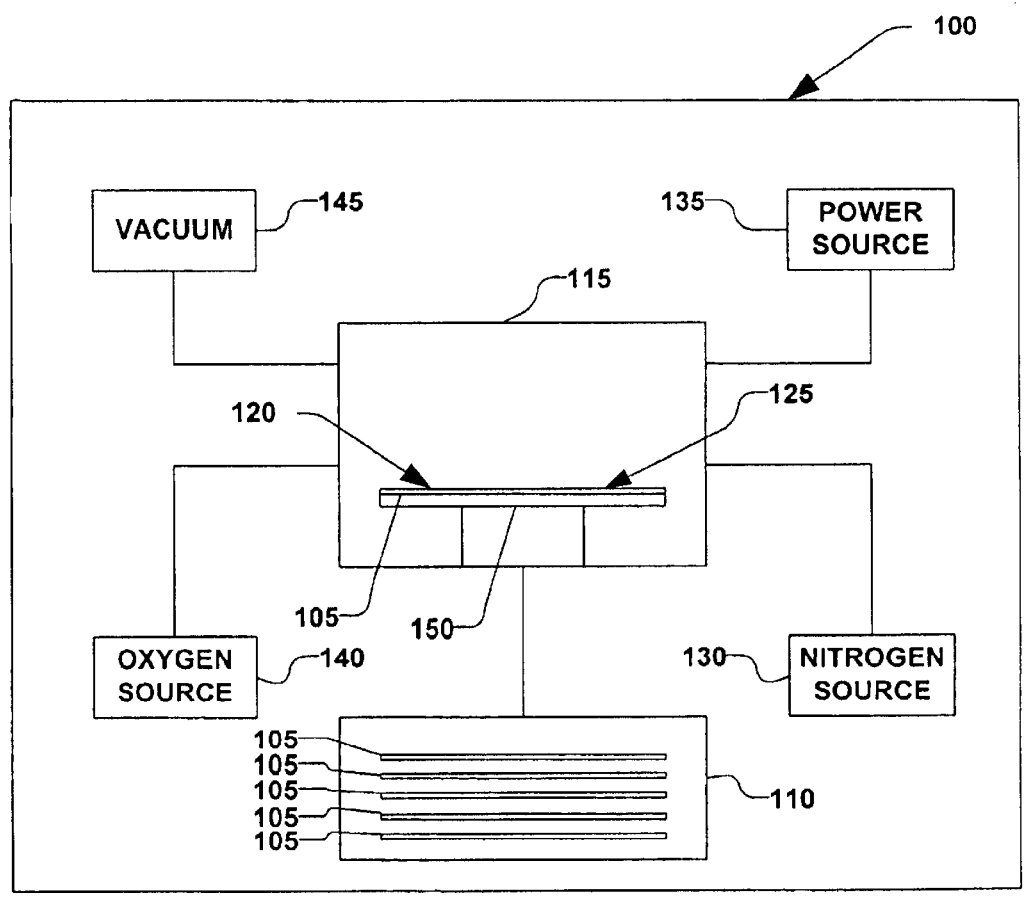
FIG. 1 is a block diagram of an exemplary system for removing AMCs according to one aspect of the present invention.

One or more exemplary implementations of the present invention will now be described with reference to the attached drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

The present invention is generally related to a method for processing a semiconductor wafer, wherein an amount of hydrocarbon contaminants residing on a surface of the wafer are significantly reduced. More particularly, the present invention relates to an improved method of forming a gate dielectric layer, wherein hydrocarbon contaminants residing over the gate dielectric are significantly reduced, therein providing a more efficient nitridation of the gate dielectric layer. The reduction in hydrocarbon contaminants can be achieved by exposing the gate dielectric to a first plasma formed from an oxygen gas, wherein the first plasma is effective to combine with the hydrocarbons to form carbon dioxide gas and hydrogen gas, thus mitigating the blockage of a subsequent nitridation of the gate dielectric due to hydrocarbon contamination. This results in the formation of a gate dielectric with a substantially lower EOT and a substantially higher and more uniform nitrogen content due, at least in part, to the removal of the hydrocarbon contamination, as compared to EOT and nitrogen content of a gate dielectric which is formed without having hydrocarbon contamination removed.

FIG. 1 illustrates an exemplary system 100 for processing one or more substrates 105 in accordance with one aspect of the present invention. The system 100, for example, comprises a holding area 110 and a process chamber 115, wherein each substrate 105, such as a silicon wafer, is operable to transfer between the holding area and the process chamber. The holding area 110, for example, may comprise an ambient environment, wherein the one or more substrates 105 reside prior to being transferred into the process chamber 115. A length of time in which each of the one or more substrates 105 reside in the holding area 110, for example, can vary, depending on various considerations, such as process throughput and cycle times, batch prioritization, as well as many other factors. The length of time in which each of the one or more substrates 105 reside in the holding area 110, however, has an impact on an amount of hydrocarbons (not shown) deposited on a surface 120 of each of the substrates.

The holding area 110, for example, comprises a clean room environment, wherein contamination to the one or more substrates 105 by outside sources (e.g., environmental contamination such as dust, debris, etc.) is generally limited. Even though the clean room environment is, by design, configured to minimize contamination to the one or more substrates 105, some contamination to the surface 120 of each substrate 105 can still occur, such as by exposure to air and airborne molecular contaminants (AMCs). The AMCs, such as organic hydrocarbons (i.e., hydrocarbon contamination), can stem from various sources, such as from previous processing or cleanup operations (e.g., residual photoresist material which was not completely removed by the previous processing), and deleteriously affect subsequent processing (e.g., a nitridation) of the one or more substrates 105. Hydrocarbon contamination on the surfaces 120 of the one or more substrates 105 can further have a cumulative effect over time when the substrates reside in the holding area 110. For example, the length of time each substrate 105 resides in the holding area is associated with an amount of hydrocarbon contamination which is deposited on the surface 120 of the substrate.

According to one exemplary aspect of the present invention, the surface 120 of each substrate 105, for example, comprises a gate dielectric layer 125. For example, prior to being placed in the holding area 110, the gate dielectric layer 125 (e.g., a silicon dioxide ($SiO_2$) layer) is formed over each substrate 105, wherein the gate dielectric layer has an exemplary thickness of between about 7 Å and 30 Å. In one example, the gate dielectric layer 125 is formed by wet and/or dry thermal oxidation processing, such as in-situ steam generation (ISSG) and low-pressure (reduced pressure) rapid thermal processing (LP-RTP). It is to be appreciated that alternate methodologies can also be employed to form the gate dielectric layer 125. For example, any suitable technique (e.g., plasma enhanced chemical vapor deposition (CVD), thermal enhanced CVD and spin on techniques) may be employed in forming the gate dielectric layer 125. Some exemplary CVD processes include, but are not limited to, low pressure CVD (LPCVD), plasma enhanced CVD (PECVD), and rapid thermal CVD (RTCVD). Furthermore, It is to be appreciated that other types of thin film formation processes may be employed to form the gate dielectric layer 125, such as other deposition techniques (e.g., physical vapor deposition (PVD)) and film growth techniques.

The gate dielectric layer 125, for example, is comprised of $SiO_2$ or another suitable oxide material, wherein the gate dielectric layer material is operable to perform a predetermined operation in a transistor (not shown) associated with the gate dielectric layer. Other exemplary materials which can be utilized as the gate dielectric layer 125 include, but are not limited to, $AlO_3$, $ZrO_2$, $HfO_2$ (AlHf) $O_x$, $HfO_2$, $La_2O_3$ and $Y_2O_3$. It will be understood by one skilled in the art that appropriate types of deposition techniques can be employed to grow suitable crystalline structures to form gate dielectric layers 125 having varying compositions, such as those identified above, and all such techniques are contemplated as falling within the scope of the present invention. Following the formation of the gate dielectric layer 125, each substrate 105 is placed (e.g., individually, or in a batch such as in a wafer cassette) in the holding area 110, wherein each substrate resides until further processing is performed on the substrate.

Exposure to AMCs after the formation of the gate dielectric layer 125 (e.g., while the one or more substrates 105 reside in the holding area 110), however, can deleteriously affect electrical characteristics of the gate dielectric layer 125 upon further processing. For example, according to another exemplary aspect of the present invention, the system 100 further comprises a nitrogen source 130 and one or more power sources 135 (e.g., one or more plasma generators such as RF, ECR, or microwave plasma generators) operably coupled to the process chamber 115, wherein the process chamber 115 is operable to perform a plasma nitridation of the gate dielectric layer 125 on the substrate 105 when the substrate is placed therein. The plasma nitridation process can include applying nitrogen-source gas, such as $N_2$, $N_2O$, NO, and $NH_3$ or a mixture of a nitrogen-source gas and inert gases, such as He, Ne, Ar, Kr, Xe, and mixtures thereof, from the nitrogen source 130 to the surface 120 of the gate dielectric layer 125. A ratio ranging between approximately 1 part nitrogen-source gas to 10 parts inert gas and approximately 1 part nitrogen-source gas to 100 parts inert gas, for example, can be utilized.

The plasma nitridation process generally introduces nitrogen atoms into the gate dielectric layer 125, wherein the nitrogen atoms mitigate gate leakage current associated with a gate device of the transistor (not shown), as well as block boron into an active channel associated with the transistor. Plasma nitridation of the dielectric layer 125, for example, advantageously incorporates nitrogen into the gate dielectric layer, wherein the nitrogen modifies a barrier height (e.g., a distance which an electron must overcome to jump from an electrode residing above the gate dielectric layer to the substrate residing below the gate dielectric layer) such that the barrier height is greater, thus reducing the gate leakage current associated with the gate dielectric layer.

Figure 2:
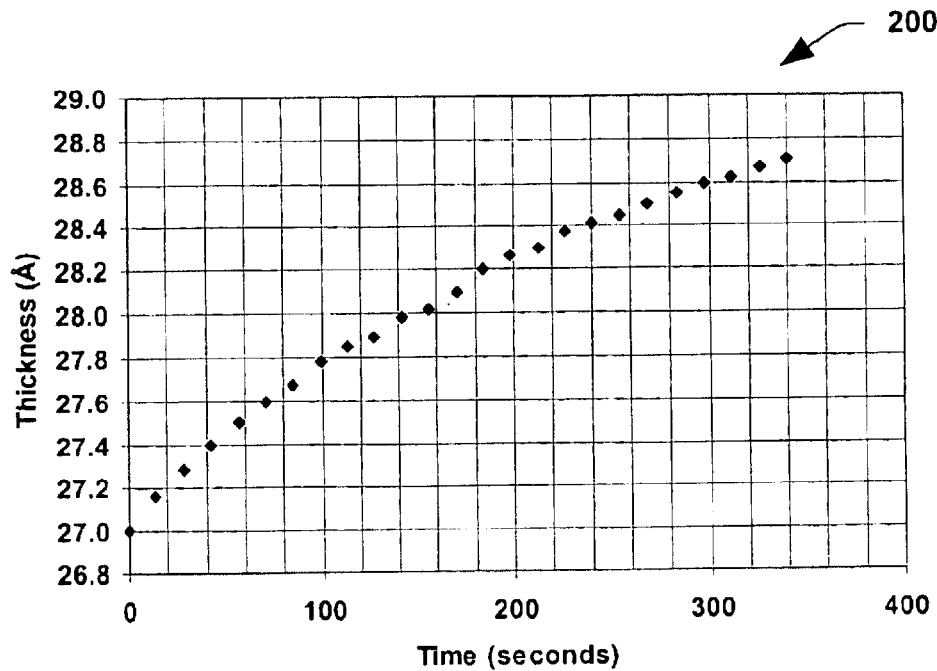
FIG. 2 is a graph illustrating exemplary changes in electrical oxide thickness over time due to effects caused by AMCs.

AMCs residing on the surface 120 of the gate dielectric layer 125, however, block a portion of the incorporation of nitrogen (nitridation) into the gate dielectric layer, therein providing a non-optimal and non-uniform nitridation of the gate dielectric layer. Such a non-optimal and non-uniform nitridation can deleteriously increase an equivalent oxide thickness (EOT) of the gate dielectric layer 125, as opposed to a nitridation of a gate dielectric layer which is generally free from AMCs. For example, FIG. 2 is a graph 200, illustrating EOT (Å) as a function of time (seconds), wherein the substrate 105 of FIG. 1 generally resides in the holding area 110 for various amounts of time. AMCs which accumulate on the surface of the substrate 105 over time can be seen in the increase in EOT after plasma nitridation, as illustrated in graph 200 of FIG. 2. In other words, the AMCs accumulating on the substrate over time successively blocks more and more nitrogen during subsequent nitridation processing, therein increasing a dielectric constant of the gate dielectric layer 125 of FIG. 1.

Figure 3:
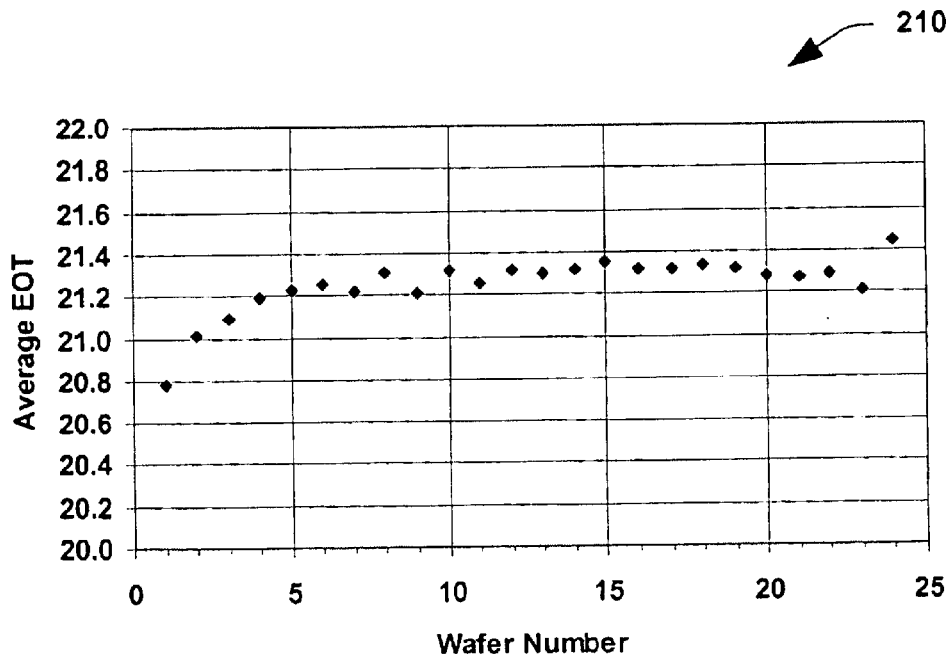
FIG. 3 is a graph illustrating exemplary changes in electrical oxide thickness due to effects caused by AMCs based on wafer number.

Furthermore, when the substrates are processed in a serial process, for example, wherein individual substrates from a batch of substrates are processed separately, substrates of the batch which are processed earlier will typically have lower EOTs than substrates processed later, since the earlier substrates have less time to accumulate AMCs as compared to the later substrates. Therefore, variable EOTs across a single batch of wafers can be evidenced when AMCs are not removed prior to nitridation. This phenomena is referred to as an "initial wafer effect" (IWE), and FIG. 3 illustrates another exemplary graph 210 of EOT as a function of wafer number (i.e., the order in which the wafers or substrates are processed) for a batch of wafers. As can be see in the graph 210, the EOT of each substrate in the batch increases with wafer number, since the later substrates have had more time to accumulate AMCs than earlier substrates.

Therefore, the system 100 of FIG. 1 further comprises an oxygen source 140 operably coupled to the one or more power sources 135 and the process chamber 115, and one or more pumping elements 145, wherein the oxygen source is operable to selectively introduce oxygen into the process chamber. In accordance with another exemplary aspect of the present invention, the oxygen source 140 is operable to flow an oxygen-source gas into the process chamber 115, wherein the one or more power sources 135 (e.g., one or more plasma generators) are operable to excite the oxygen-source gas into a plasma form for a plasma oxidation process. The oxygen-source gas, for example, comprises one or more oxygen-containing gases, such as $O_2$, $N_2O$, NO or a mixture of the oxygen-containing gas and inert gases, such as He, Ne, Ar, Kr, Xe, and mixtures thereof. The mixture of oxygen-source gas, for example, comprises a ratio ranging between approximately 1 part oxygen-containing gas to 10 parts inert gas and approximately 1 part oxygen-containing gas to 100 parts inert gas.

Upon an interaction of the oxygen plasma and the AMCs (e.g., organic hydrocarbons), one or more radicals of oxygen and the AMCs combine to form product gases, such as hydrogen gas ($H_2$) and carbon dioxide ($CO_2$), thereby substantially converting the AMCs into product gases and reducing the amount of AMCs on the gate dielectric layer 125. The one or more pumping elements 145 are further operable to remove the product gases from the process chamber 115, therein leaving a substantially AMC-free surface 120 of the gate dielectric layer which can be subsequently nitrided, wherein the nitridation is generally uniform across the substrate and generally repeatable from substrate to substrate.

Pressure within the process chamber 115 can be maintained by the one or more pumping elements 150, wherein the one or more pumping elements are operative to introduce or evacuate gas from the chamber to within a desired pressure range. In one aspect of the invention, the plasma oxidation process can be performed in the process chamber 115 for less than approximately 5 seconds, such that the AMCs are substantially react with the oxygen radicals to form the product gases without forming additional oxides on the surface 120 of the gate dielectric layer 125. The plasma nitridation process, for example, can be performed in the process chamber 115 for between approximately 10 seconds and 60 seconds using nitrogen radical species to incorporate nitrogen into the gate dielectric layer 125. In accordance with another example, the substrate 105 resides on a heater stage 150, wherein the heater stage is operable to substantially heat the substrate. For example, the heater stage 150 is operable to heat the substrate 105 from room temperature up to approximately 500° C. during processing of the substrate.

According to yet another exemplary aspect of the present invention, the system 100 is configured such that the process chamber 115 comprises two or more separate process chambers (not shown) interconnected by a transfer module (not shown), wherein the plasma oxidation process and the plasma nitridation process are performed in respectively separate process chambers. The transfer module, for example, comprises a high vacuum (low pressure) environment, wherein AMC growth on the surface 120 of the substrate 105 is generally minimized during a transfer between the separate process chambers. Furthermore, following the nitridation process, for example, the substrate 105 can be transferred to yet another process chamber (not shown), such as a thermal oxidation chamber, for further processing via a similar transfer module (not shown).

Figure 4:
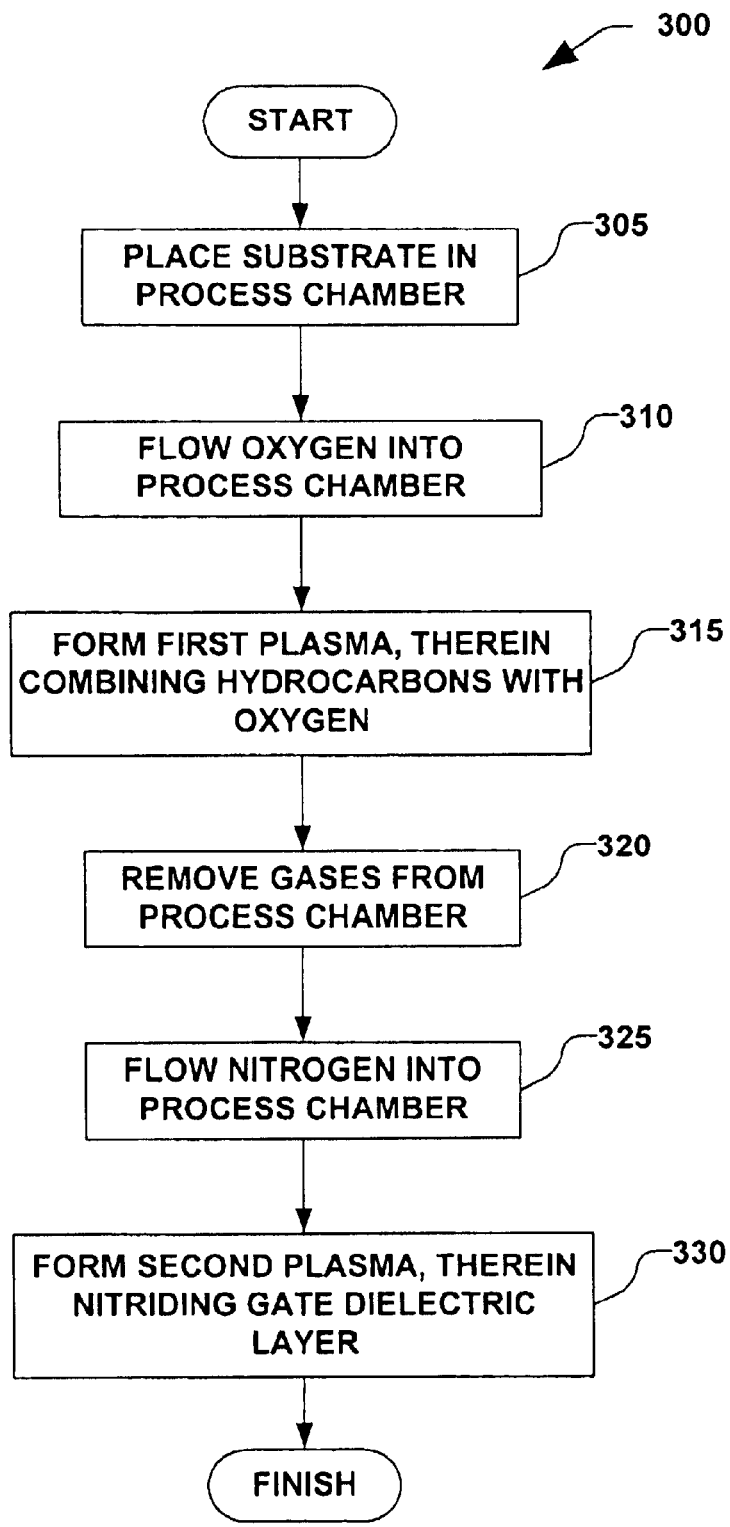
FIG. 4 illustrates a method of processing a substrate according to one exemplary aspect of the present invention.

According to another exemplary aspect of the present invention, FIG. 4 illustrates a method 300 of fabricating a gate dielectric structure using the system described above. The method 300 can be further understood by FIGS. 5A–5D, wherein several acts are illustrated according to one exemplary aspect of the invention. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Figure 5A:
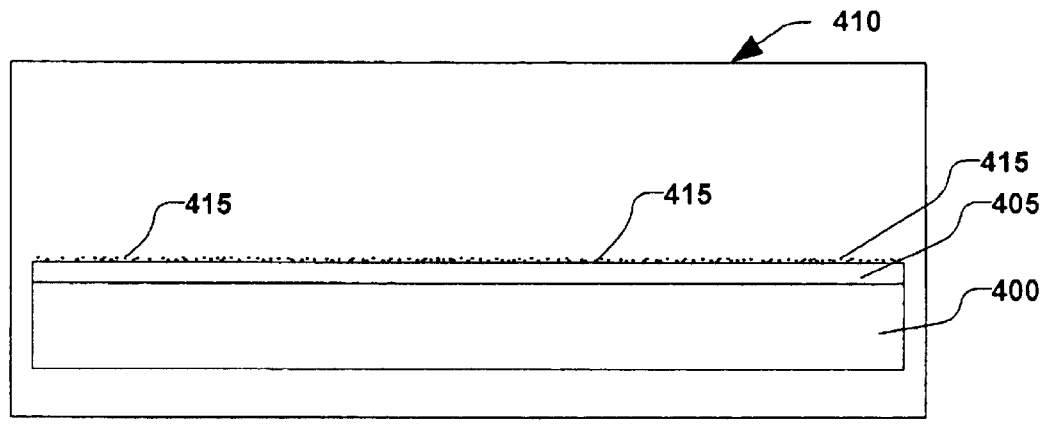
FIGS. 5A–5D illustrate partial cross-sectional views of a substrate in various stages of processing according to another exemplary aspect of the present invention.

The method 300 of FIG. 4 begins at 305, wherein a substrate, such as a silicon wafer, is provided in a process chamber, wherein the substrate comprises a gate dielectric layer formed thereon. The substrate can be placed into the process chamber, for example, by transferring the substrate from a holding area such as a load lock chamber, another process chamber, or an ambient environment. FIG. 5A illustrates the substrate 400 comprising the gate dielectric layer 405 which has been previously formed on the wafer, wherein the substrate is provided in the process chamber 410. The substrate 400, for example, comprises AMCs 415 deposited thereon, wherein the AMCs were deposited onto the substrate when the substrate previously resided in the holding area, for example. Such AMCs 415 comprise, for example, hydrocarbon contamination from the holding area environment (not shown), and/or residual hydrocarbon material from processes occurring previous to the present methodology.

Figure 5B:
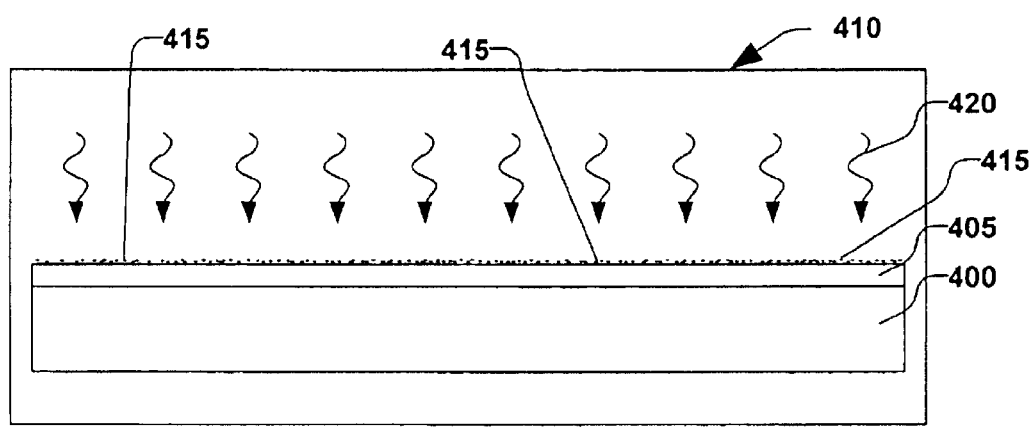

The process chamber 410, for example, can be evacuated to a pressure of less than approximately 1 Torr. In act 310, an oxygen-source gas is flowed into the process chamber at a first pressure, and in act 315, a first plasma is formed within the process chamber, wherein the oxygen is transformed into the first plasma by an application of a first power (e.g., a first plasma generator). The first pressure and first power, for example, are determined based, at least in part, on the type of plasma generator employed to form the first plasma. For example, if a microwave plasma generator (e.g., operating at 2.45 GHz) is utilized, a general range for the first pressure can be between approximately 0.05 Torr and 2 Torr, employing a first power of between approximately 500 and 2000 Watts, wherein the first plasma is formed for a first predetermined amount of time. FIG. 5B illustrates the substrate 400 undergoing exposure to the first plasma 420, wherein the first predetermined amount of time is kept short (less than approximately 5 seconds), using oxygen radical species such that oxidation of the surface 425 of the gate dielectric layer 405 does not significantly occur. The first predetermined amount of time, for example, can further be determined based on an amount of AMCs on the surface 425 of the gate dielectric layer 405. Such a short plasma oxidation is referred to as "spike radical oxidation", wherein one or more radicals of the oxygen-source gas in the first plasma 420 are operable to combine with the AMCs 415 to form one or more resultant gases (not shown). The one or more resultant gases, for example, comprise one or more of carbon dioxide ($CO_2$), hydrogen gas ($H_2$), and water vapor ($H_2O_{(vapor)}$).

Figure 5C:
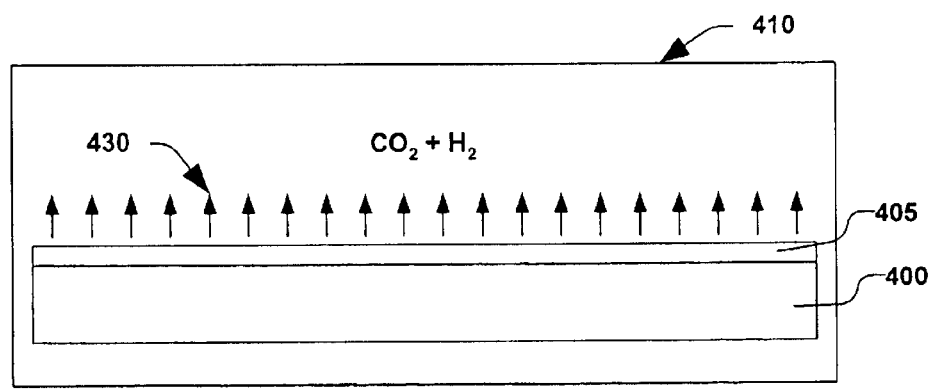

Referring again to FIG. 4, in act 320, the one or more resultant gases are removed from the process chamber. FIG. 5C illustrates the substrate 400 after the spike radical oxidation, wherein the AMCs (not shown) have generally combined with the one or more radicals of oxygen to form the one or more resultant gases 430, wherein one or more vacuum elements (not shown) generally remove the one or more resultant gases from the process chamber 410. The one or more vacuum elements (not shown), for example, are operable to generally evacuate the process chamber 410 to approximately 0 Torr. After acts 315 and 320 of FIG. 4 for example, the surface 425 of the gate dielectric layer 405 is generally AMC-free, wherein further processing can be performed on the substrate 400 without significant deleterious effects from the removed AMCs.

Figure 5D:
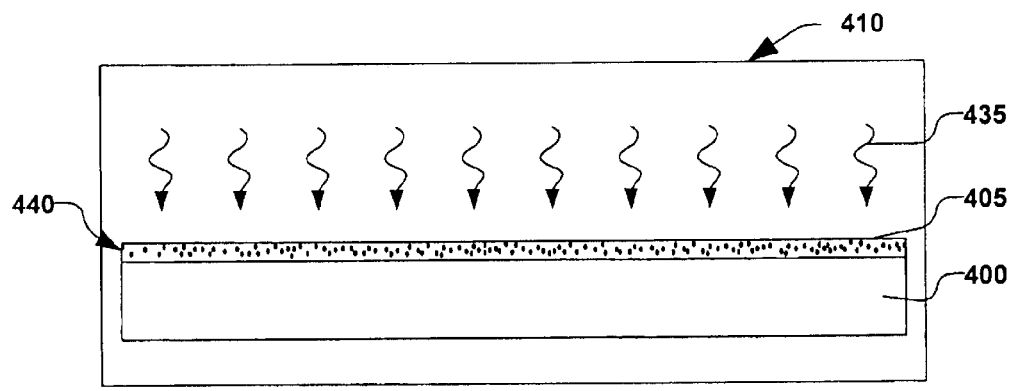

In act 325 of FIG. 4, for example, a nitrogen-source gas is flowed into the process chamber at a second pressure, and a second plasma is formed in the process chamber, wherein the nitrogen-source gas is transformed into the second plasma by an application of a second power. The second pressure and second power, for example, are determined based, at least in part, on the type of plasma generator employed to form the second plasma. For example, if a microwave plasma generator (e.g., operating at 2.45 GHz) is utilized, a general range for the second pressure can be between approximately 0.05 Torr and 2 Torr, employing a second power of between approximately 500 and 3000 Watts. The second plasma is formed for a second predetermined amount of time, and FIG. 5D illustrates the substrate 400 undergoing exposure to the second plasma 435, wherein the second predetermined amount of time is determined, for example, by process requirements (e.g., between approximately 10 seconds and 60 seconds), using nitrogen radical species, such that a nitridation of the surface 425 of the gate dielectric layer 405 occurs, therein forming a nitrided gate dielectric layer 440.

The processed substrate 400 comprising the nitrided gate dielectric layer 440, for example, can subsequently be re-oxidized or densified to remove any plasma damage or lattice damage to the gate dielectric layer 405 during nitridation. For example, the re-oxidation can be performed by RTO at a temperature from between approximately 900° C. and 1050° C. and a pressure of about 0.5 Torr to about 50 Torr in about 50% to 100% of an oxygen-containing gas (e.g., $O_2$, $N_2O$, or NO), wherein the oxygen-containing gas, for example, is further mixed with one or more inert gases such as He, $N_2$, etc.

Figure 6:
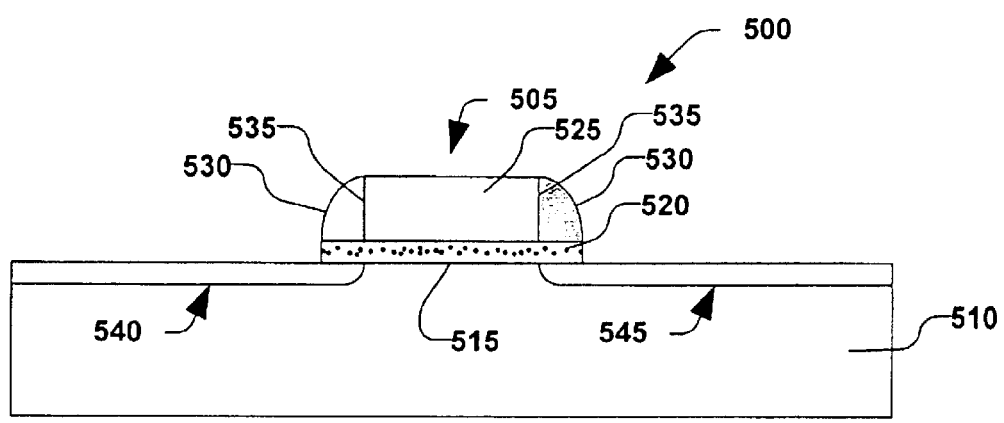
FIG. 6 illustrates a cross-sectional view of an exemplary transistor structure formed according to another exemplary aspect of the invention.

According to another exemplary aspect of the present invention, FIG. 6 illustrates a transistor device 500 (e.g., a CMOS device) having a gate structure 505. The transistor device 500, for example, can be fabricated on a substrate 510, such as a silicon wafer. It should be noted that the transistor device 500 is provided for illustrative purposes, and that the substrate 510 can include a plurality of transistor devices. The transistor device 500, for example, comprises a thin gate dielectric layer 515 (e.g., an oxide layer ranging between approximately 7 Å and 30 Å in thickness). The gate dielectric layer 515 can be an oxide (e.g., silicon dioxide ($SiO_2$)) or any other dielectric material suitable for operating as a gate oxide of a transistor device. Since the gate dielectric layer 515 is relatively thin, nitrogen atoms 520 are introduced into the gate dielectric layer to suppress leakage currents associated with an operation of the transistor device 505. As discussed above, a removal of hydrocarbons (not shown) prior to introducing the nitrogen atoms 520, for example, can significantly increase the nitridation of the gate dielectric layer 515. For example, the hydrocarbons are removed by spike radical oxidation, as discussed above, and nitrogen atoms 520 are further introduced into the gate dielectric layer 515 by a plasma nitridation.

The transistor device 500, for example further comprises a gate electrode 525 that is generally disposed over the gate dielectric layer 515. The gate electrode 525, for example, is comprised of polysilicon, amorphous silicon, germanium, or a metal. Exemplary sidewall spacers 530 of a suitable insulating material are further disposed adjacent to sidewalls 535 of the gate electrode 525. A source region 540 and a drain region 545, for example, are further formed in the substrate 510. The source and drain regions 540 and 545, for example, cn further comprise source/drain extensions (not shown) that extend to regions generally aligned with and partially beneath edges of the gate electrode 525, as will be understood by one of ordinary skill in the art. It should also be noted that the transistor device may comprise a P-type or an N-type transistor. For example, the source and drain regions 540 and 545 can be formed as P-type or N-type regions by doping the source and drain regions with arsenic, boron, or other appropriate doping materials.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method for processing a substrate having hydrocarbons or other airborne molecular contaminants residing thereon, the method comprising:
    placing the substrate having a gate dielectric thereon in a process chamber;
    flowing an oxygen-source gas into the process chamber at a first pressure;
    forming a first plasma with the oxygen-source gas in the process chamber at a first power for a first predetermined amount of time, therein combining the hydrocarbons or other airborne molecular contaminants with oxygen species of the first plasma to form product gases;
    removing the product gases from the process chamber, therein reducing an amount of hydrocarbons or other airborne molecular contaminants on the substrate;
    flowing a nitrogen/source gas into the process chamber at a second pressure; and
    forming, a second plasma with the nitrogen-source gas in the process chamber at a second power for a second predetermined amount of time, therein nitriding the gate dielectric of the substrate.

2. The method of claim 1, wherein the oxygen species of the first plasma comprises one or more species of oxygen gas radicals.

3. The method of claim 1, wherein the product gases comprise one or more of carbon dioxide gas and hydrogen gas.

4. The method of claim 1, wherein the first predetermined amount of time is less than approximately five seconds.

5. The method of claim 1, wherein the first predetermined amount of time is generally dependent upon an amount of hydrocarbons on the surface of the substrate.

6. The method of claim 1, wherein the second predetermined amount of time is substantially longer than the first predetermined amount of time.

7. The method of claim 1, wherein the second predetermined amount of time is between approximately 10 seconds and 60 seconds.

8. The method of claim 1, wherein the second power substantially greater than the first power.

9. The method of claim 1, further comprising annealing the substrate, wherein lattice damage is significantly repaired.

10. The method of claim 1, wherein the first pressure and the second pressure are between approximately 0.05 Torr and 2 Torr.

11. The method of claim 1, wherein removing the product gases from the process chamber comprises pumping down the process chamber to approximately 0 Torr.

12. A method for forming a transistor over a semiconductor substrate, the method comprising:
    placing the substrate in a process chamber, wherein the substrate comprises a gate dielectric layer having a top surface, and wherein one or more contaminants reside on the top surface of the gate dielectric layer;
    flowing an oxygen-source gas into the process chamber at a first pressure;
    forming a first plasma with the oxygen-source gas in the process chamber at a first power for a first predetermined amount of time, therein combining the one or more airborne molecular contaminants with oxygen species of the first plasma to form one or more product gases;
    flowing a nitrogen-source gas into the process chamber at a second pressure; and
    forming a second plasma with the nitrogen-source gas in the process chamber at a second power for a second predetermined amount of time, therein nitriding the top surface of the gate dielectric layer; and
    removing the gases from the process chamber.

13. The method of claim 12, wherein the one or more airborne molecular contaminants comprise hydrocarbon contaminants, wherein the one or more product gases comprise carbon dioxide gas and hydrogen gas.

14. The method of claim 12, wherein the first predetermined amount of time is less than approximately five seconds.

15. The method of claim 12, wherein the first predetermined amount of time is generally dependent upon an amount of hydrocarbons on the surface of the substrate.

16. The method of claim 12, wherein the first pressure is between approximately 0.05 Torr and 2 Torr.

17. The method of claim 12, wherein the second predetermined amount of time is substantially longer than the first predetermined amount of time.

18. The method of claim 17, wherein the second predetermined amount of time is between approximately 10 seconds and 60 seconds.

19. The method of claim 12, wherein the second power is substantially greater than the first power.

20. The method of claim 12, wherein the second pressure is between approximately 0.05 Torr and 2 Torr.

21. The method of claim 12, further comprising annealing the substrate, wherein lattice damage is significantly repaired.

* * * * *